United States Patent
Esposito et al.

(10) Patent No.: US 9,214,408 B2
(45) Date of Patent: Dec. 15, 2015

(54) FLUID COOLED THERMAL MANAGEMENT TECHNIQUE FOR A HIGH-DENSITY COMPOSITE FOCAL PLANE ARRAY

(75) Inventors: Gerard A. Esposito, Chelmsford, MA (US); Dennis P. Bowler, Sudbury, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 398 days.

(21) Appl. No.: 13/603,460

(22) Filed: Sep. 5, 2012

(65) Prior Publication Data

US 2013/0063604 A1    Mar. 14, 2013

Related U.S. Application Data

(60) Provisional application No. 61/532,279, filed on Sep. 8, 2011.

(51) Int. Cl.
| | |
|---|---|
| H01L 31/024 | (2014.01) |
| H01L 31/052 | (2014.01) |
| G01J 5/06 | (2006.01) |
| H01L 23/473 | (2006.01) |

(52) U.S. Cl.
CPC ....... *H01L 23/473* (2013.01); *H01L 2924/0002* (2013.01)

(58) Field of Classification Search
CPC ..... G01J 5/061; H01L 31/024; H01L 31/0521
See application file for complete search history.

(56) References Cited

U.S. PATENT DOCUMENTS

| | | | | |
|---|---|---|---|---|
| 5,590,538 A | * | 1/1997 | Hsu et al. | 62/51.2 |
| 5,785,754 A | * | 7/1998 | Yamamoto et al. | 117/89 |
| 2003/0197266 A1 | * | 10/2003 | Simon et al. | 257/714 |
| 2010/0118168 A1 | * | 5/2010 | Silva et al. | 348/294 |

* cited by examiner

*Primary Examiner* — Mark R Gaworecki
(74) *Attorney, Agent, or Firm* — Global IP Services, PLLC; Prakash Nama; Daniel J. Long

(57) ABSTRACT

A fluid cooled thermal management technique for a high-density composite focal plane array (CPFA) is disclosed. In one embodiment, a high density CFPA assembly includes a plurality of imaging dies mounted on a front surface of a printed wiring board (PWB) and a base plate. The base plate has a substantially matched coefficient of thermal expansion (CTE) to that of the high density CFPA. Further, the high density CFPA is disposed on a front side of the base plate. Furthermore, the base plate has a plurality of integral serpentine fluid flow channels configured to receive and circulate fluid and further configured such that the heat generated by the CFPA is transferred via conduction into the base plate and to the integral serpentine fluid flow channels and to the circulating fluid to dissipate the generated heat.

16 Claims, 3 Drawing Sheets

9,214,408 B2

FLUID COOLED THERMAL MANAGEMENT TECHNIQUE FOR A HIGH-DENSITY COMPOSITE FOCAL PLANE ARRAY

CROSS-REFERENCE TO RELATED APPLICATIONS

This Application claims rights under 35 USC §119(e) from U.S. application Ser. No. 61/532,279 filed Sep. 8, 2011, the contents of which are incorporated herein by reference.

BACKGROUND OF THE INVENTION

1. Field of the Invention

The present invention relates to optical sensors, more specifically to thermal management of optical sensors.

2. Brief Description of Related Art

One of the most difficult challenges posed by high resolution imaging equipment is management of the thermal output of the many electronic components, especially the large amount of localized energy generated by the required high density of focal plane arrays (FPAs). As technology advances, the power dissipated per FPA tends to increase, as well as the number of FPAs in each optical sensor. However, in order for optical sensors and their component FPAs to function properly, the environment must be maintained below a maximum temperature. Given the high number of FPAs and their dense packaging, thermal management continues to be an increasingly important and difficult aspect of high resolution imaging.

Traditional thermal management techniques use circulated cooling air and heat sinks, usually constructed of a suitable metal, to dissipate thermal energy generated by optical sensors. Most of the existing techniques for thermal management of high resolution imaging systems including composite focal plane arrays (CFPAs) use a structure comprising an interposer positioned between the printed circuit (PC) boards, wherein at least one outer edge of the interposer is capped by a semiconductor material, such as aluminum nitride. Typically, in these techniques, a heat sink is positioned adjacent to this end-cap, in a flow path of the circulating air. However, the thermal dissipation potential of these traditional techniques has largely been maximized, and modern imaging systems exceed even this maximized dissipation capability.

SUMMARY OF THE INVENTION

A fluid cooled thermal management technique for a high-density composite focal plane array (CPFA) is disclosed. According to an embodiment of the present subject matter, a high density CFPA assembly includes a plurality of imaging dies mounted on a front surface of a printed wiring board (PWB) and a base plate. Further, the high density CFPA is disposed on a front side of the base plate. The base plate has a substantially matched coefficient of thermal expansion (CTE) to that of the high density CFPA. Furthermore, the base plate has a plurality of integral serpentine fluid flow channels configured to receive and circulate fluid and further configured such that the heat generated by the CFPA is transferred via conduction into the base plate and to the integral serpentine fluid flow channels and to the circulating fluid to dissipate the generated heat.

In addition, the high density CFPA assembly includes a back plane disposed on a back side of the base plate. The back plane is configured to receive the signal lines routed through the thickness of the PWB and then through the signal exit channels. Moreover, the high density CFPA assembly includes a fluid circulation pump fluidly coupled to the plurality of integral serpentine fluid flow channels in the base plate. Also, the high density CFPA assembly includes a fluid-to-metal-to-air heat exchanger fluidly coupled to the plurality of integral serpentine fluid flow channels in the base plate. The fluid circulation pump is configured to pump the fluid via the plurality of fluid flow channels and the fluid-to-metal-to-air heat exchanger is configured to receive the fluid from the plurality of integral serpentine fluid flow channels and to dissipate the heat.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

DETAILED DESCRIPTION OF THE INVENTION

The exemplary embodiments described herein in detail for illustrative purposes are subject to many variations in structure and design.

The terms "printed wiring board (PWB)" and "printed circuit board (PCB)" are used interchangeably throughout the document.

Figure 1:
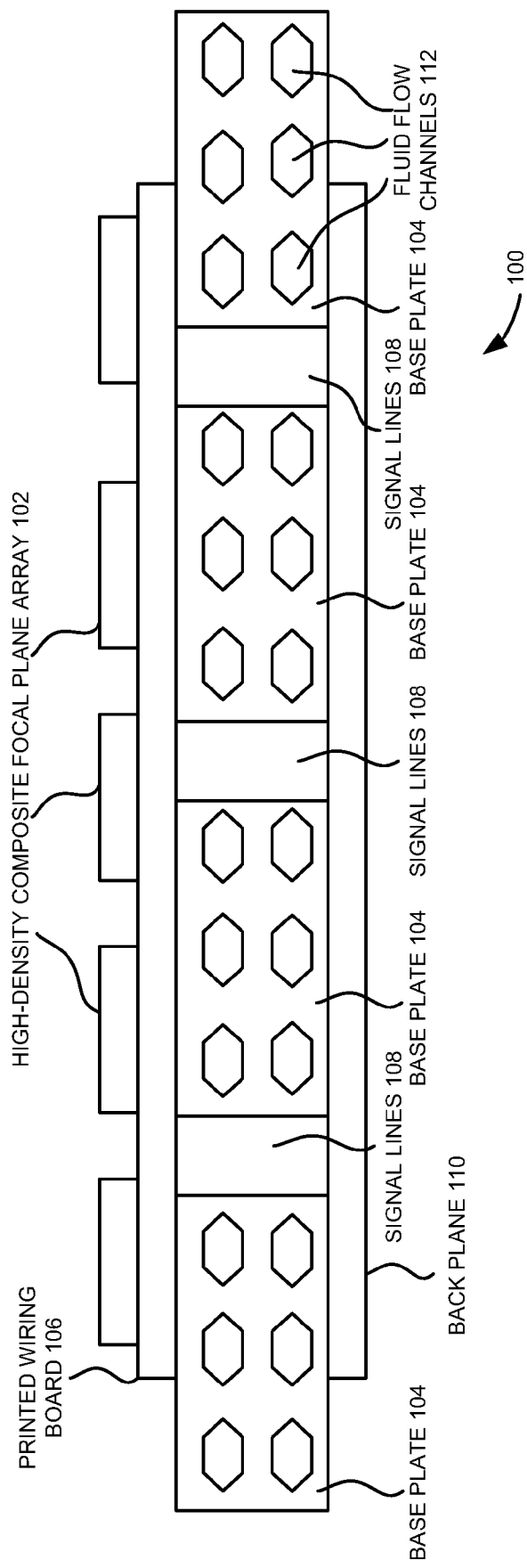
FIG. 1 is a cross sectional view of a fluid cooled high-density composite focal plane array (CFPA) assembly, according to an embodiment of the present subject matter.

FIG. 1 is a cross sectional view of a fluid cooled high-density composite focal plane array (CFPA) assembly 100, according to an embodiment of the present subject matter. Particularly, FIG. 1 illustrates the high-density CFPA assembly 100 includes a high-density CFPA 102, a base plate 104, a PWB 106 and a back plane 110. For example, the high-density CFPA 102 is an optically flat imaging plane. The high-density CFPA 102 is disposed on a front side of the base plate 104. In one embodiment, coefficient of thermal expansion (CTE) of the base plate 104 is substantially matched to that of the high-density CFPA 102. Further, the PWB 106 is a ceramic PWB and the base plate 104 is a ceramic base plate. The ceramic PWB and the ceramic base plate have substantially similar CTE.

Further as shown in FIG. 1, the high-density CFPA 102 includes a plurality of imaging dies mounted on a front surface of the PWB 106. Exemplary imaging dies is silicon based high density CFPA. For example, the plurality of imaging dies and the PWB 106 have substantially similar CTEs. Furthermore, the base plate 104 includes a plurality of integral serpentine fluid flow channels 112. In addition, the high-density CFPA 102 includes a plurality of signal lines 108 routed through the thickness of the PWB 106 to the back surface that is disposed across from the mounted front side of the imaging dies. Also, the back plane 110 is disposed on a back side of the base plate 104. In one embodiment, the base plate 104 including the fluid flow channels 112 is configured to receive and circulate fluid and further configured such that the heat generated by the high-density CFPA 102 is transferred via conduction into the base plate 104 and to the integral serpentine fluid flow channels 112 and to the circulating fluid to dissipate the generated heat. This is explained in more detail with reference to FIG. 3.

Figure 2:
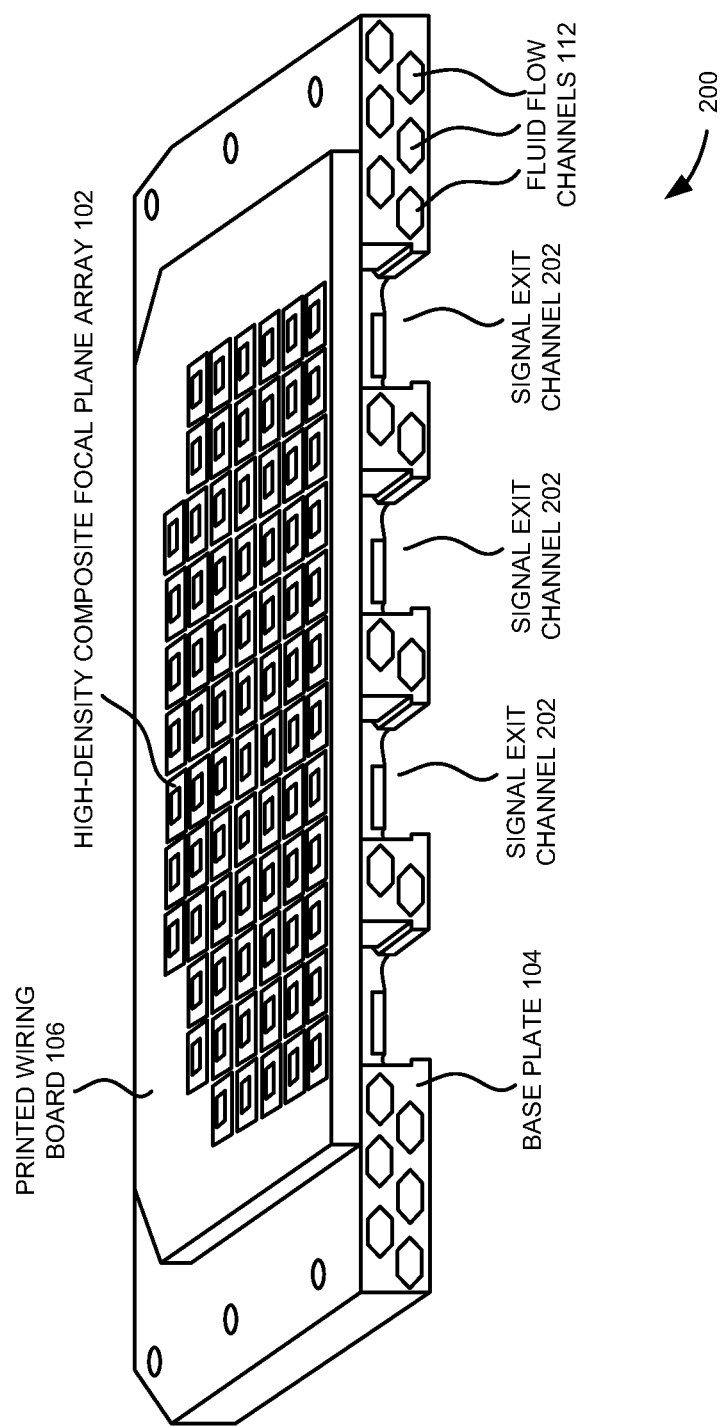
FIG. 2 is a cross sectional isometric view of the fluid cooled high-density CFPA, such as the one shown in FIG. 1, according to an embodiment of the present subject matter.

Referring now to FIG. 2, which is a cross sectional isometric view 200 of the fluid cooled high-density CFPA 102, such as the one shown in FIG. 1, according to an embodiment of the present subject matter. Particularly, FIG. 2 illustrates the high-density CFPA 102, the base plate 104, the PWB 106, the fluid flow channels 112 and a plurality of signal exit channels 202. As shown, the base plate 104 includes the plurality of signal exit channels 202. The plurality of signal exit channels 202 are configured to route the plurality of signal lines 108, shown in FIG. 1, coming through the thickness of the PWB 106 and the back surface of the PWB 106. Further, the back plane 110 is configured to receive the signal lines 108 routed through the thickness of the PWB 106 and then through the signal exit channels 202.

Figure 3:
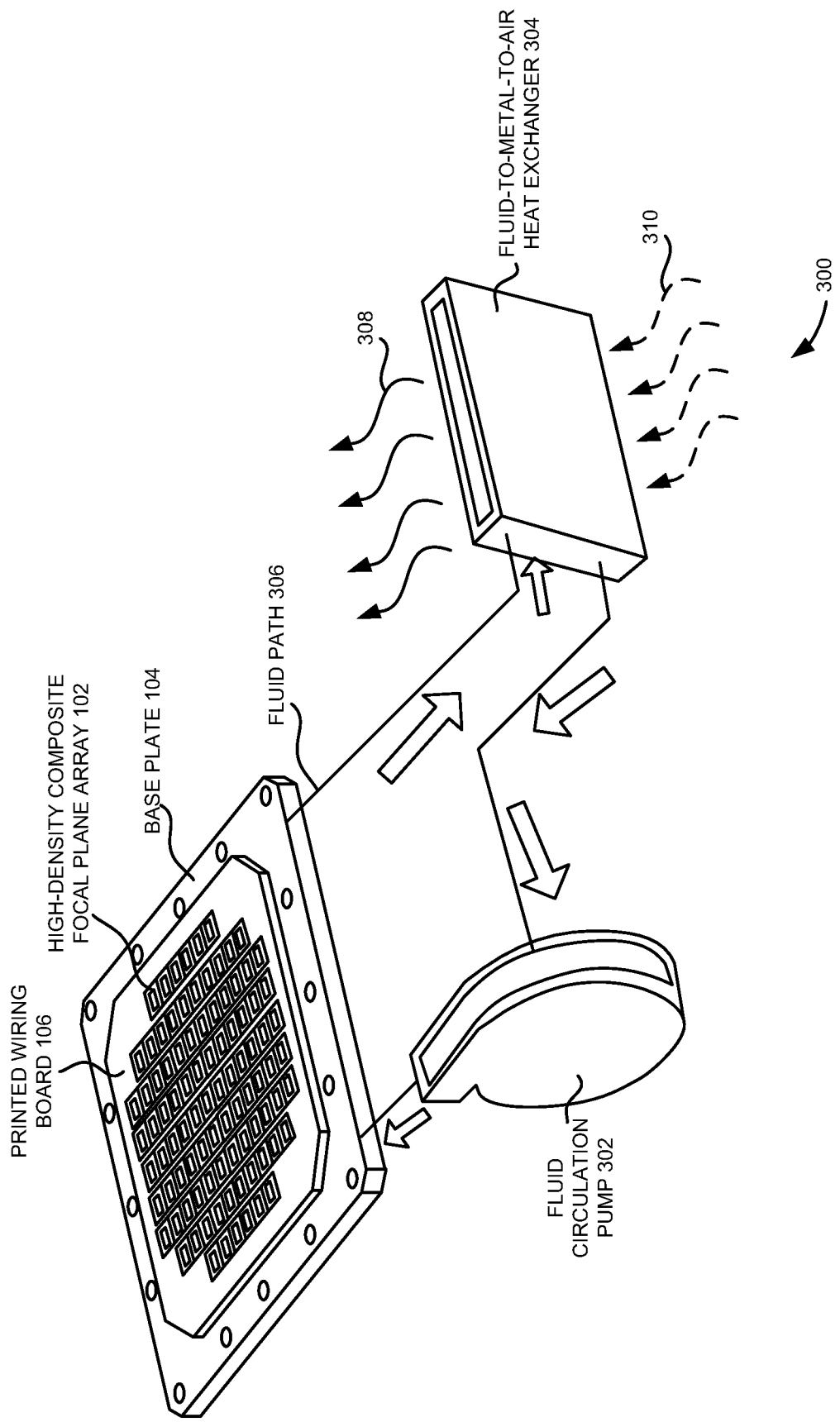
FIG. 3 illustrates an example block diagram of a thermal management system for the fluid cooled high-density CFPA, such as the one shown in FIG. 1.

Referring now to FIG. 3, which illustrates an example block diagram 300 of a thermal management system for the fluid cooled high-density CFPA 102, such as the one shown in FIG. 1. Particularly, FIG. 3 illustrates the high-density CFPA 102, the base plate 104, the PWB 106, a fluid circulation pump 302, a fluid-to-metal-to-air heat exchanger 304, and a fluid path 306. As shown, the fluid circulation pump 302 is fluidly coupled to the plurality of integral serpentine fluid flow channels 112, shown in FIGS. 1 and 2, in the base plate 104 by the fluid path 306. Further, the fluid-to-metal-to-air heat exchanger 304 is fluidly coupled to the plurality of integral serpentine fluid flow channels 112 in the base plate 104 by the fluid path 306. Furthermore, the fluid circulation pump 302 is coupled to the fluid-to-metal-to-air heat exchanger 304 by the fluid path 306. In one embodiment, the fluid-to-metal-to-air heat exchanger 304 is a radiator designed to dissipate heat from the fluid via a convection air flow.

In operation, the fluid circulation pump 302 is configured to pump the fluid via the plurality of fluid flow channels 112 to absorb the heat dissipated by the high-density CFPA 102. The heat generated by the high-density CFPA 102 is transferred via conduction into the base plate 104 and to the integral serpentine fluid flow channels 112 and to the circulating fluid to dissipate the generated heat. Exemplary properties of the fluid include material compatibility with the base plate 104, anti-freeze, substantially high boiling temperature, and high thermal conductivity/carrying capability. Further, the fluid-to-metal-to-air heat exchanger 304 is configured to receive the fluid from the plurality of integral serpentine fluid flow channels 112 and to dissipate the heat. The arrows 310 indicates the cool air passing through the fluid-to-metal-to-air heat exchanger 304 and the arrows 308 indicates hot air dissipated from the fluid-to-metal-to-air heat exchanger 304. In one example implementation, a thermal imaging camera includes the fluid cooled high-density CFPA assembly 100, shown in FIG. 1.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A fluid cooled high-density composite focal plane array (CFPA) assembly, comprising:
    a high density CFPA including a plurality of imaging dies mounted on a front surface of a printed wiring board (PWB), wherein the high density CFPA further comprises a plurality of signal lines routed through the thickness of the PWB to a back surface that is disposed across from the mounted front side of the plurality of imaging dies;
    a base plate having a substantially matched coefficient of thermal expansion (CTE) to that of the high density CFPA, wherein the high density CFPA is disposed on a front side of the base plate, wherein the base plate further having a plurality of integral serpentine fluid flow channels and configured to receive and circulate fluid and further configured such that the heat generated by the CFPA is transferred via conduction into the base plate and to the integral serpentine fluid flow channels and to the circulating fluid to dissipate the generated heat, and wherein the base plate having a plurality of signal exit channels configured to route the plurality of signal lines coming through the thickness of the PWB and the back surface of the PWB;
    a fluid circulation pump configured to pump the fluid into the plurality of serpentine fluid flow channels; and
    a fluid-to-metal-to-air heat exchanger configured to receive the fluid from the plurality of integral serpentine fluid flow channels and to dissipate the heat.

2. The fluid cooled high-density CFPA assembly of claim 1, further comprising:
    a back plane disposed on a back side of the base plate, wherein the back plane is configured to receive the signal lines routed through the thickness of the PWB and then through the signal exit channels.

3. The fluid cooled high-density CPFA assembly of claim 1, wherein the fluid circulation pump is fluidly coupled to the plurality of integral serpentine fluid flow channels in the base plate; and
    the fluid-to-metal-to-air heat exchanger is fluidly coupled to the plurality of integral serpentine fluid flow channels in the base plate.

4. The fluid cooled high-density CPFA assembly of claim 3, wherein the fluid-to-metal-to-air heat exchanger is a radiator designed to dissipate heat from the fluid via a convection air flow.

5. The fluid cooled high-density CPFA assembly of claim 1, wherein the PWB is a ceramic PWB and wherein the base plate is a ceramic base plate and wherein the ceramic PWB and the ceramic base plate have substantially similar CTE.

6. The fluid cooled high-density CPFA assembly of claim 1, wherein the properties of the fluid are selected from the group consisting of material compatibility with the base plate, anti-freeze, substantially high boiling temperature, and high thermal conductivity/carrying capability.

7. The fluid cooled high-density CPFA assembly of claim 1, wherein the high density CFPA is an optically flat imaging plane.

8. The fluid cooled high-density CPFA assembly of claim 1, wherein the plurality of imaging dies is silicon based high density CFPA.

9. The fluid cooled high-density CPFA assembly of claim 1, wherein the plurality of imaging dies and the PWB have substantially similar CTEs.

10. A thermal imaging camera, comprising:
a fluid cooled high-density composite focal plane array (CFPA) assembly, including:
  a high density CFPA including a plurality of imaging dies mounted on a front surface of a printed wiring board (PWB), wherein the high density CFPA further comprises a plurality of signal lines muted through the thickness of the PWB to a back surface that is disposed across from the mounted front side of the plurality of imaging dies;
  a base plate having a substantially matched coefficient of thermal expansion (CTE) to that of the high density CFPA, wherein the high density CFPA is disposed on a front side of the base plate, wherein the base plate further having a plurality of integral serpentine fluid flow channels configured to receive and circulate fluid and further configured such that the heat generated by the CFPA is transferred via conduction into the base plate and to the integral serpentine fluid flow channels and to the circulating fluid to dissipate the generated heat, and wherein the base plate having a plurality of signal exit channels configured to route the plurality of signal lines coming through the thickness of the PWB and the back surface of the PWB;
  a fluid circulation pump configured to pump the fluid into the plurality of serpentine fluid flow channels; and
  a fluid-to-metal-to-air heat exchanger configured to receive the fluid from the plurality of integral serpentine fluid flow channels and to dissipate the heat.

11. The thermal imaging camera of claim 10, further comprising:
  a back plane disposed on a back side of the base plate, wherein the back plane is configured to receive the signal lines routed through the thickness of the PWB and then through the signal exit channels.

12. The thermal imaging camera of claim 10, wherein the PWB is a ceramic PWB and wherein the base plate is a ceramic base plate and wherein the ceramic PWB and the ceramic base plate have substantially similar CTE.

13. The thermal imaging camera of claim 10, wherein the properties of the fluid are selected from the group consisting of material compatibility with the base plate, anti-freeze, substantially high boiling temperature, and high thermal conductivity/carrying capability.

14. The thermal imaging camera of claim 10, wherein the high density CFPA is an optically flat imaging plane.

15. The thermal imaging camera of claim 11, wherein the plurality of imaging dies is silicon based high density CFPA.

16. The thermal imaging camera of claim 10, wherein the plurality of imaging dies and the PWB have substantially similar CTEs.

* * * * *